(12) United States Patent  
Wang et al.

(10) Patent No.: US 7,008,240 B1
(45) Date of Patent: Mar. 7, 2006

(54) PC CARD ASSEMBLY

(75) Inventors: KuangYu Wang, Saratoga, CA (US); Ren-Kang Chiou, Fremont, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 0 days.

(21) Appl. No.: 10/826,110

(22) Filed: Apr. 16, 2004

(51) Int. Cl.
*H01R 12/00* (2006.01)
(52) U.S. Cl. ............... 439/76.1; 439/946; 361/737
(58) Field of Classification Search ............. 439/76.1, 439/946; 361/736, 737, 759, 741
See application file for complete search history.

(56) References Cited

U.S. PATENT DOCUMENTS

| | | | |
|---|---|---|---|
| 5,563,769 A | 10/1996 | MacGregor | |
| 5,891,483 A | 4/1999 | Miyajima | |
| 6,040,622 A | 3/2000 | Wallace | |
| 6,102,743 A | 8/2000 | Haffenden et al. | |
| 6,166,913 A | 12/2000 | Fun et al. | |
| 6,217,685 B1 | 4/2001 | Leydier et al. | |
| D445,096 S | 7/2001 | Wallace | |
| D452,690 S | 1/2002 | Wallace et al. | |
| D452,865 S | 1/2002 | Wallace et al. | |
| D453,934 S | 2/2002 | Wallace et al. | |
| 6,381,143 B1 | 4/2002 | Nakamura | |
| 6,399,906 B1 | 6/2002 | Sato et al. | |
| 6,410,355 B1 | 6/2002 | Wallace | |
| 6,462,273 B1 | 10/2002 | Corisis et al. | |
| 6,527,188 B1 | 3/2003 | Shobara et al. | |
| 6,624,005 B1 | 9/2003 | DiCaprio et al. | |
| 6,634,561 B1 | 10/2003 | Wallace | |

*Primary Examiner*—Khiem Nguyen
(74) *Attorney, Agent, or Firm*—Bever, Hoffman & Harms, LLP; Patrick T. Bever

(57) ABSTRACT

A PC card assembly including a printed circuit board assembly (PCBA) and an associated two-piece housing made up of a frame-like body and a top cover. The PCBA includes a printed circuit board (PCB) and a connector that is attached to one end of the PCB. The frame-like body includes parallel side rails and an end rail formed with a step-like mounting structure that includes a peripheral shelf for supporting at least two edges of the PCB, and several alignment protrusions that extend from inside portions of the side rails onto the shelf that engage with alignment notches formed in the PCB during the assembly process. Depressions are formed in top and bottom walls for receiving ICs mounted on the PCB. The frame-like body defines an optional longitudinal slot for slidably receiving the PCB. A top cover is either ultrasonically welded or snap-coupled onto the frame-like body.

6 Claims, 7 Drawing Sheets

PC CARD ASSEMBLY

FIELD OF THE INVENTION

The present invention generally pertains to PCMCIA card-like devices (aka "PC cards"), and more particularly to structures and methods for assembling ExpressCard™-type PC cards.

BACKGROUND OF THE INVENTION

Portable Computer Memory Card International Association (PCMCIA) card devices, which are now simply referred in industry as "PC cards", are credit card-size peripheral devices that are used, for example, to add memory, mass storage, and I/O capabilities to computers. PC cards includes a small printed circuit board (PCB) encased in a rugged housing, and are produced according to a variety of form factors. Each PC card typically includes a pin/socket-type connector located at one end of the housing that facilitates convenient pluggable connection of the PC card to a host system, although other connector types (e.g., surface mount) are also used. The PC card connector and data interchange formats are standardized, and mechanical and electrical standards have also been established to ensure proper connection of PC card to the host system. For example, according to one form factor, each PC card includes a standardized 68-pin connector, with each pin having a defined function.

PC card production typically involves forming a printed circuit board assembly (PCBA), and then securing the PCB assembly in a suitable housing such that the connector is exposed outside the housing. The PCBA is produced by mounting selected integrated circuit (IC) components as well as a suitable connector onto a printed circuit board (PCB). The PCBA is then typically mounted (fitted) into a housing that typically includes an open plastic frame for holding the PCB, and then a top cover is secured (joined) to the frame such that the PCB is covered and the connector is exposed at one end.

A problem associated with conventional PC cards is that the PCB can be misaligned during the conventional assembly process, resulting in a damaged or otherwise inadequate PC card. That is, due to the small size of modern PC cards (e.g., the ExpressCard™/34 Module developed by Intel Corp. of Santa Clara, Calif., which is has a length of 75 mm, a width of 34 mm, and a thickness (height) of 5 mm), the features of the associated PCBA are extremely small, making proper alignment difficult. If the PCB if misaligned with reference to the frame during the assembly process (i.e., during or after fitting, and before joining), then the PCB may be damaged during the joining process, which can lead to production delays and associated increased production costs.

What is needed is a PC card assembly that addresses the above problems associated with conventional PC cards.

SUMMARY OF THE INVENTION

The present invention is directed to a PC card assembly and to a method for producing a PC card assembly that addresses the problems associated with conventional PC cards, and in particular to small form factors such as the ExpressCard/34 or ExpressCard/54 Modules, by providing a housing and PCB assembly (PCBA) with complimentary structural features that facilitate a combined fitting and joining process that greatly simplifies the overall assembly process.

According to an embodiment of the present invention, a PC card assembly includes a printed circuit board assembly (PCBA) and an associated two-piece housing made up of a frame-like body and a top cover. The PCBA includes a printed circuit board (PCB) and a connector that is attached to one end of the PCB. The frame-like body includes a lower (first) wall having an inner surface, parallel elongated side rails extending upward along side edges of the lower wall, and an end rail extending upward from a closed end of the lower wall and connecting one end of the side rails. The lower wall, side rails and end rail define a pocket for receiving the PCB of the PCBA, with the connector of the PCBA extending from an open end of the pocket (i.e., the end opposite to the end rail). The cover includes an upper (second) wall that is attached to the upper surface of the side and end rails, thereby forming a housing that secures the PCB between the upper and lower walls.

According to an aspect of the present invention, the frame-like body is provided with a step-like mounting structure that includes a peripheral shelf for supporting at least two edges of the PCB, and several alignment protrusions that extend from inside portions of the side rails onto the shelf that engage with alignment notches formed in the PCB during the assembly process, thereby precisely positioning the PCBA relative to the frame-like body with a minimum amount of effort, thus minimizing production costs.

According to another aspect of the present invention, the upper and lower walls of the housing define a plurality of depressions or grooves that are positioned to receive IC devices extending from the upper and lower surfaces of the PCB, and the upper and lower walls include ribs or relatively thick wall sections along the edges of the depressions/grooves. The depressions/grooves define relatively thin sections of the upper and lower walls that face or abut corresponding IC structures which further facilitate the combined fitting and joining process while minimizing the overall height of the assembled PC card. Further, the ribs/thick sections provide structural rigidity and/or strength that increase the durability of the assembled PC card.

According to an embodiment of the present invention, the frame-like body defines a longitudinal slot extending from the open end to the closed end (end rail) for slidably receiving the PCB during the assembly process. The step-like shelf structure forms, e.g., a lower surface of the longitudinal slot. The alignment protrusions and alignment notches are sized such that the alignment protrusions press against the sides of the PCB during slidable insertion, and then securely engage the alignment notches when the PCB is fully inserted into the frame-like body. The longitudinal slot minimizes handling of and damage to the PCB during the assembly process, thus reducing overall manufacturing costs. In addition, the longitudinal slot provides a reliable structure for securing the PCB assembly inside the PC card, thereby resisting damage caused, for example, when the PC card is dropped or otherwise subjected to mechanical shock.

According to another aspect of the present invention the top cover is ultrasonically welded or snap-coupled onto the frame-like body. In one embodiment, a series of upstanding ultrasonic bonding (connection) features are provided along the upper surface of the side and end rails that facilitate ultrasonic welding to corresponding surfaces of the top cover. In another embodiment, the top cover includes alignment pins that are received in corresponding alignment holes formed in the frame-like body, and elongated ribs formed on the top cover are fitted over corresponding peripheral walls formed on the side rails of the frame-like body, thereby facilitating snap-coupling of the top cover onto the frame-like body.

According to another embodiment of the present invention, a method for producing a PC card includes generating or otherwise procuring the frame-like body described above, mounting the PCBA such that the PCB is placed into the pocket and/or slid into the longitudinal slot through the open end of the frame-like body in the manner described above, and then securing the top cover to the side and end rails of the frame-like body. In one embodiment, the top cover is ultrasonic welded to the side and end rails of the frame-like body. In another embodiment, the top cover is snap-coupled to the frame-like body utilizing the structures described above.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 1:
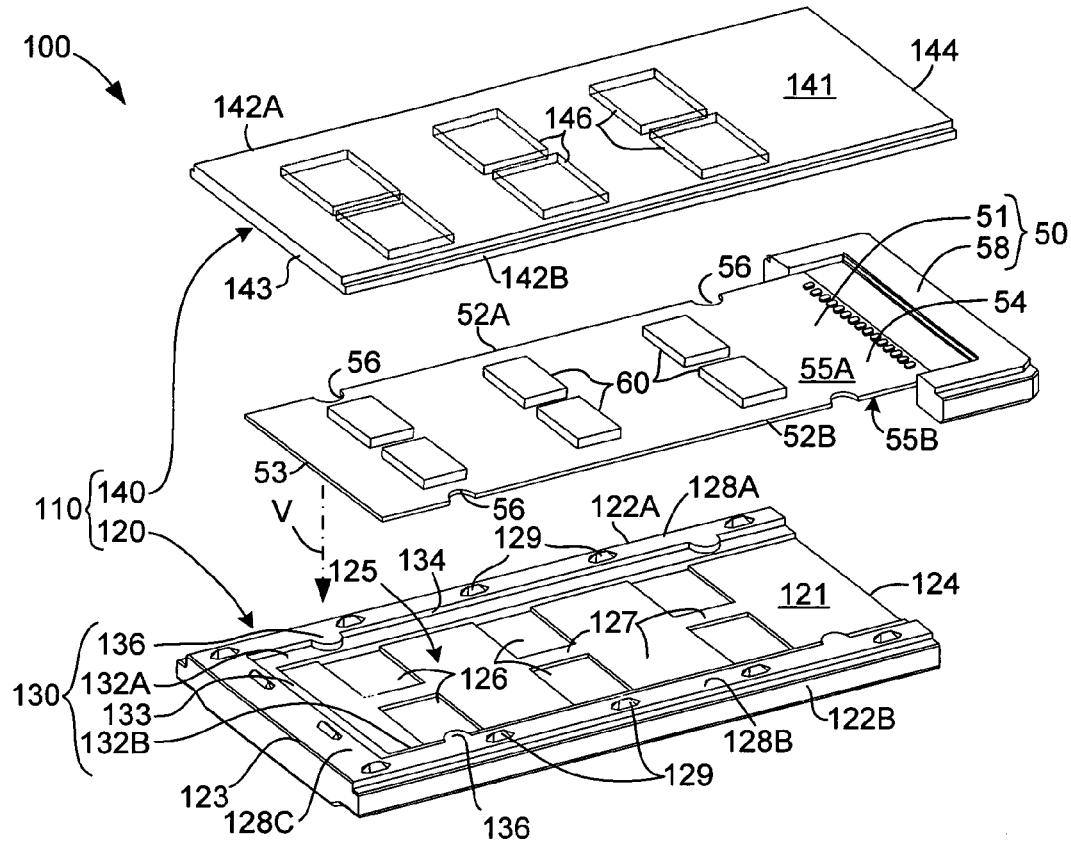
FIG. 1 is an exploded perspective view showing a PC card assembly according to an embodiment of the present invention.
Figure 2:
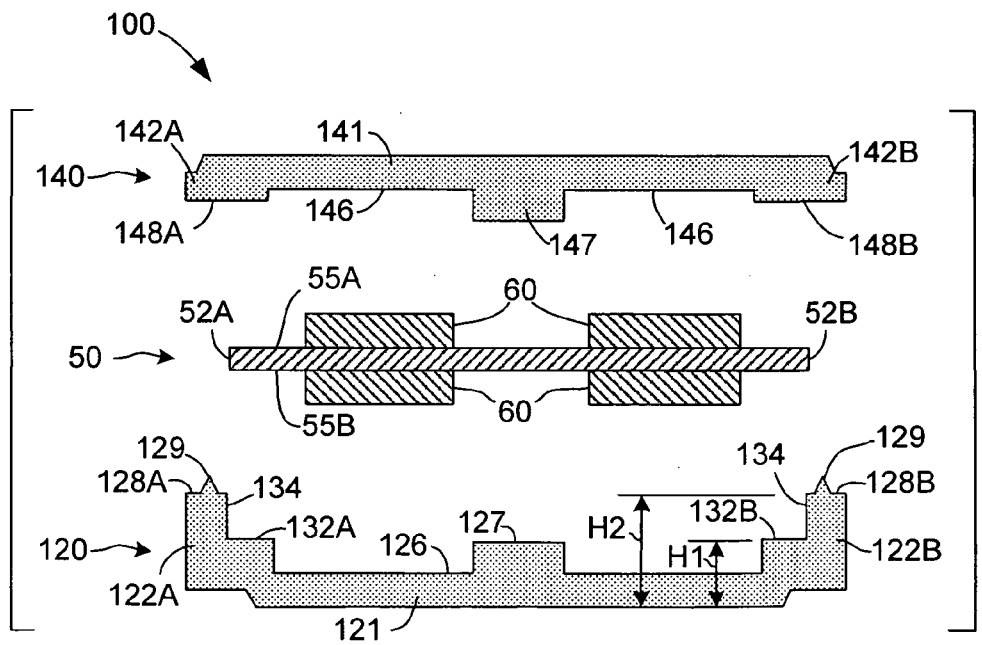
FIG. 2 is a simplified cross-sectional end view showing the PC card assembly of FIG. 1.
Figure 3:
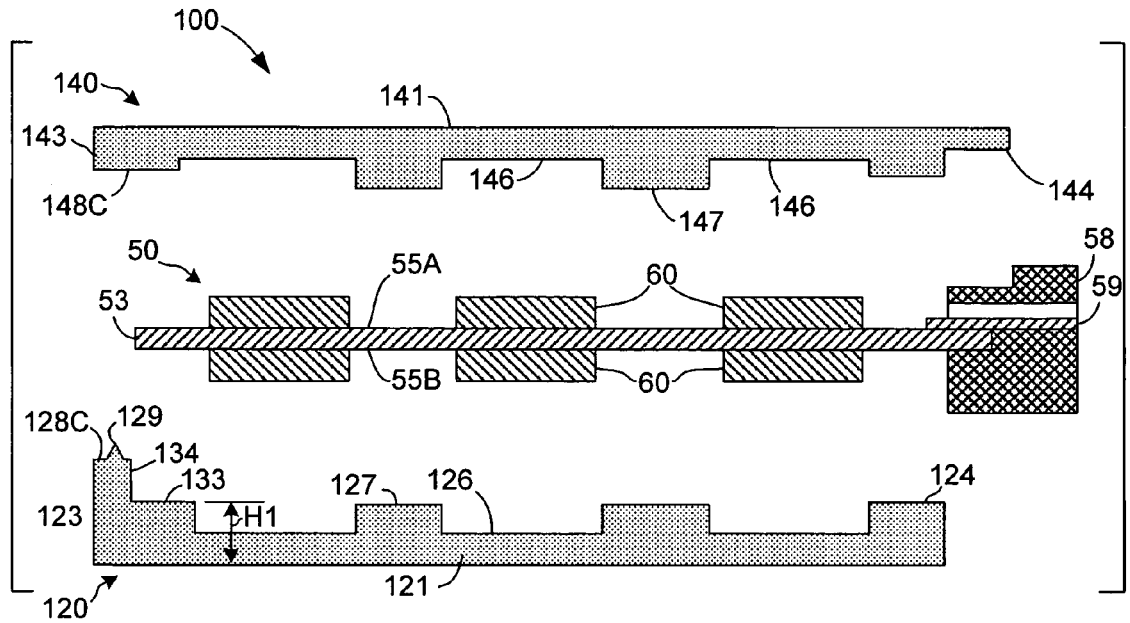
FIG. 3 is a simplified cross-sectional side view showing the PC card assembly of FIG. 1.

FIG. 1 is an exploded perspective view showing a PC card assembly 100 according to an embodiment of the present invention. FIGS. 2 and 3 are simplified cross-sectional end and side views showing PC card assembly 100. As indicated in these figures, PC card assembly 100 includes a printed circuit board assembly (PCBA) 50 and a two-piece housing 110 made up of a frame-like body 120 and a top cover 140.

Referring to the center of FIG. 1, PCB assembly 50 generally includes a PCB 51 and a connector 58. PCB 51 is sized generally according to a predefined form factor (e.g., consistent with the PCI Express Architecture developed by Intel Corp. of Santa Clara, Calif.), and includes one or more ICs 60 and/or other electronic components mounted to at least one of an upper surface 55A and a lower surface 55B. In the present embodiment, PCB 51 is generally rectangular in shape, and includes parallel side edges 52A and 52B, and parallel rear and front end edges 53 and 54 located at respective ends of side edges 52A and 52B. Connector 58, which also conforms to the selected form factor, is mounted onto (front) edge 54 of PCB 51, and includes pins (e.g., pin 59, shown in FIG. 3) that communicate with ICs 60 via corresponding traces (also not shown) formed on PCB 51 according to well-known practices.

Referring to the lower portion of FIG. 1, frame-like body 120 includes a lower wall 121, parallel side rails 122A and 122B respectively connected to opposing side edges of lower wall 121, and an end rail 123 extending along a front end edge of lower wall 121. An open end 124 is defined along a front end edge of lower wall 121 (i.e., the end opposite end rail 123). As described in further detail below, lower wall 121, side rails 122A and 122B and end rail 123 define a pocket 125 for receiving PCB 51 of PCBA 50 such that connector 58 extends through open end 124. In the present embodiment, side rails 122A and 122B define peripheral upper surface portions 128A and 128B having connections features 129 formed thereon. Similar connections features are formed on an upper wall portion 128C extending across end rail 123. In one embodiment, frame-like body 120 is molded or otherwise formed from a synthetic resin or other electrically insulating material, and conforms in size with the PC ExpressCard form factor.

Top cover 140 generally includes a substantially flat (upper) wall 141 having side edges 142A and 142B, a rear edge 143 and a front edge 144. As discussed below, top cover 140 also includes a lower peripheral surface including portions 148A, 148B and 148C that mirror peripheral upper surface portions 128A, 128B and 128C of frame-like body 120, thereby facilitating attachment (e.g., by ultrasonic welding) of top cover 140 onto frame-like body 120 after PCBA 50 is mounted therein. Top cover 110 is typically manufactured from the same material used to form frame-like body 120 (e.g., molded or otherwise formed synthetic resin), and is sized according to a selected form factor.

According to an aspect of the present invention, frame-like body 120 is provided with a step-like mounting structure 130 that includes a peripheral shelf formed by side shelf portions 132A and 132B that extend along side rails 122A and 122B, respectively, and an optional end shelf portion 133 that extends along end rail 123. As indicated in FIG. 2, shelf portions 132A and 132B are located an intermediate height H1 from a lowermost surface of lower wall 121. As discussed further below, height H1 is selected to maintain PCBA 50 at a predetermined positioned within housing 110. Referring again to FIG. 2, vertical upper wall portions 134 are extruded with and extend from shelf portions 132A and 132B and upper surface portions 128A and 128B such that upper surface portions 128A and 128B are located at a height H2 from the lowermost surface of wall 121, where height H2 is greater than height H1. Referring to FIG. 3, shelf portion 133 is also located at the intermediate height H1 from a lowermost surface of lower wall 121. As discussed in detail below, shelf portions 132A, 132B and 133 serve to support peripheral edges of PCB 51 at a selected height (i.e., height H1) that maintains PCB 51 in an optimal assembly position relative to frame-like body 120. In one embodiment, the height H1 is selected such that PCB 51 is maintained approximately along the centerline of the PC card thickness in the height direction (e.g., for ExpressCard/34 Module structures, in the range of approximately 2.3 mm to 3.25 mm), thereby facilitating easier placement of ICs 60 extending from both surfaces of PCB 51. In addition, step-like mounting structure 130 also includes several alignment protrusions 136 that extend from upper wall portions 134 onto shelf portions 132A and 132B, toward the center of frame-like body 120. During assembly, alignment protrusions 136 engage with alignment notches 56 formed in PCB 51 (shown in FIG. 1) to precisely positioning PCBA 50 relative to frame-like body 120 with a minimum amount of effort, thus minimizing production costs by combining the processes of fitting and joining PCBA 50 to frame-like body 120.

According to another aspect of the present invention, at least one of lower wall 121 and upper wall 141 define depressions (relatively thin portions) and associated ribs (relatively thick portions) that are arranged to receive portions of ICs 60. Referring to FIG. 1, lower wall 121 defines depressions 126 and includes ribs 127, and upper wall 141 defines depressions 146 and includes ribs 147. As indicted in FIGS. 2 and 3, depressions 126 and 146 are generally aligned with ICs 60. As discussed below, depressions 126 and 146 define relatively thin sections of lower wall 121 and 141, respectively, that receive and/or abut corresponding ICs 60 during the assembly process, which further facilitates the combined fitting and joining process while minimizing the overall height of the assembled PC card. Further, ribs 127 and 147 provide structural rigidity and/or strength that increase durability.

Figure 4:
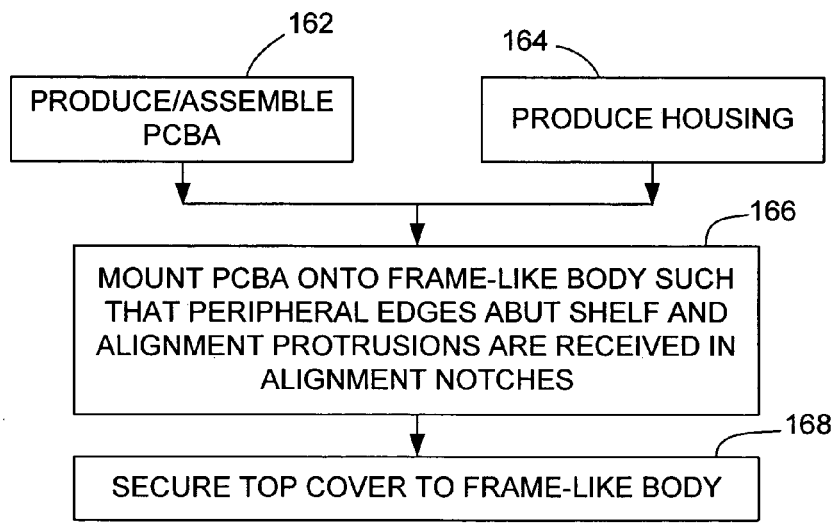
FIG. 4 is a flow diagram showing a simplified assembly method according to an embodiment of the present invention.

FIG. 4 is a flow diagram showing a generalized assembly method for producing PC cards according to another embodiment of the present invention. The method begins by producing or otherwise procuring PCBA 50 and frame-like body 120 (blocks 162 and 164, respectively). Next, PCBA 50 is mounted onto frame-like body 120 such that the peripheral side edges of the PCB are supported on the step-like mounting structure formed in the frame-like body, and such that the alignment protrusions are received in the alignment notched formed in the PCB (block 166). The top cover 140 is then secured to the side and end rails of frame-like body 120, e.g., by ultrasonic welding (block 168).

Figure 5:
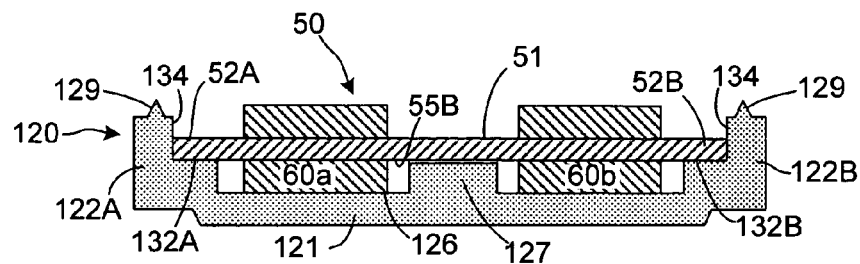
FIG. 5 is a simplified cross-sectional end view showing portions of the PC card assembly of FIG. 1 during a first assembly stage.
Figure 6:
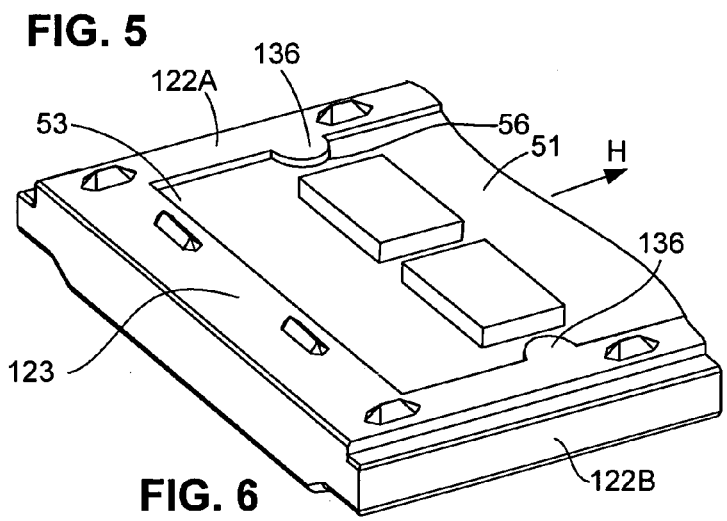
FIG. 6 is a partial perspective view showing the portions of the PC card assembly of FIG. 1 during assembly.
Figure 7A:
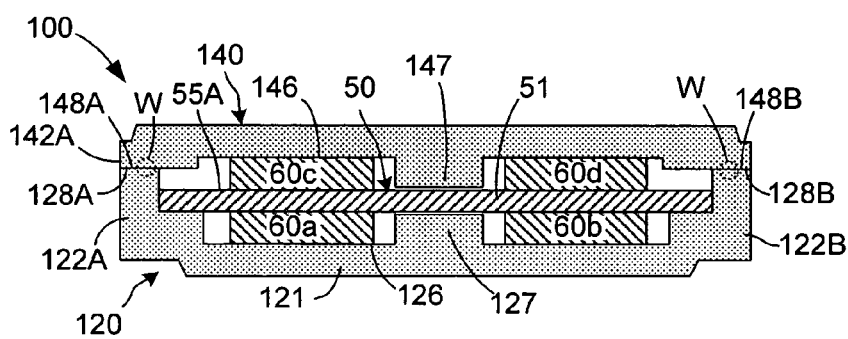
FIGS. 7(A) and 7(B) are simplified cross-sectional end and side views, respectively, showing the PC card assembly of FIG. 1 after assembly.
Figure 7B:
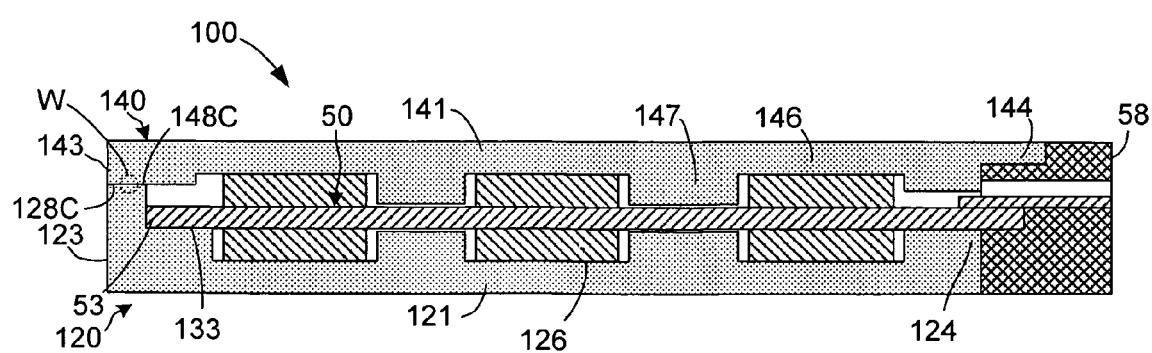

The assembly process of FIG. 4 is illustrated with reference to PC card assembly 100 in FIGS. 5, 6, 7(A) and 7(B), where FIGS. 5 and 6 show PCB 51 of PCBA 50 mounted on frame-like body 120 (block 166 of FIG. 4), and FIGS. 7(A) and 7(B) show the PC card after top cover 140 is attached (block 168 of FIG. 4). Referring to FIG. 5, when PCBA 50 is mounted onto frame-like body 120, peripheral side edges 52A and 52B are respectively supported on shelf portions 132A and 132B, and ICs 60a and 60b (which extend from lower surface 55B of PCB 51) are received in respective depressions 126 formed in lower wall 121. In one embodiment, depressions 126 are sized such that a lower surface of ICs 60a and 60b abuts lower wall 121, thereby increasing the overall structural integrity of the assembled PC card. Peripheral side edges 52A and 52B are aligned with upper wall portions 134 of the frame-like body 120. In addition, as indicated in FIG. 6, each alignment notch 56 formed on IC 51 receives a corresponding alignment protrusion 136, thereby maintaining PCB 51 in a predetermined position relative to frame-like body 120 (e.g., preventing movement of PCB 51 in the horizontal direction indicated by arrow H). In one embodiment, glue (or another adhesive) is used to firmly attach PCB 51 to frame-like body 120.

Subsequently, as indicated in FIGS. 7(A) and 7(B), top cover 140 is secured onto frame-like body 120 (block 168 of FIG. 4). First, top cover 140 is positioned over frame-like body 120 such that the lower surfaces of top cover 140 are aligned with the upper rail surfaces of frame-like body 120. For example, as indicated in FIG. 7(A), top cover 140 is shown positioned such that lower surfaces 148A and 148B are aligned with upper wall surface portions 128A and 128B of frame-like body 120, respectively. Similarly, as indicated in FIG. 7(B), lower surface 148C is aligned with upper wall surface portion 128C. In this position, according to the first embodiment, ultrasonic bonding (connection) features 129 (shown in FIG. 5) abut lower surfaces 148A and 148B. Top cover 140 is then secured to frame-like body 120, for example, by ultrasonic welding such that connection features 129 (shown in FIG. 5) are melted provide a suitable connection between upper wall surface portions 128A, 128B and 128C with lower surfaces 148A, 148B and 148C, respectively (e.g., welding joint region W, as indicated in FIGS. 7(A) and 7(B)). Note that, as indicated in FIG. 7(A), ICs 60c and 60d (which extend from upper surface 55A of PCB 51) are received in respective depressions 146 formed in upper wall 141 such that upper wall contacts the upper surface of ICs 60c and 60d, and that rib 147 is positioned between ICs 60c and 60d.

Figure 8:
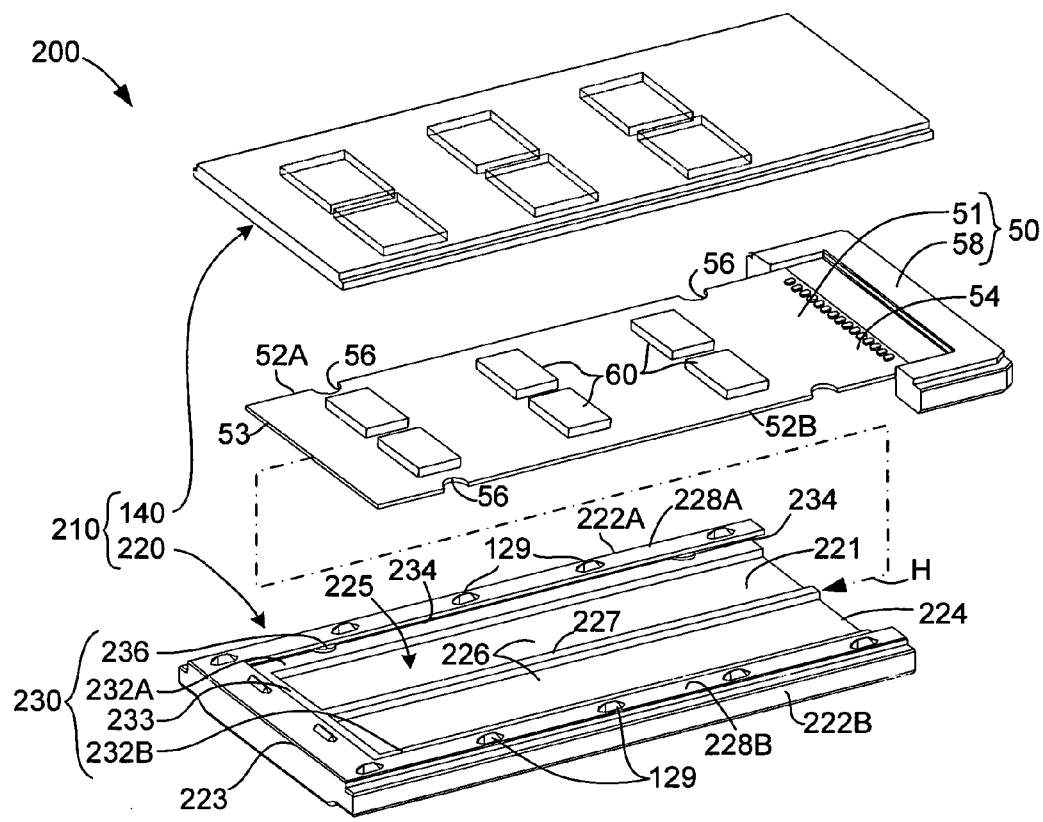
FIG. 8 is an exploded perspective view showing a PC card assembly according to another embodiment of the present invention.
Figure 9A:
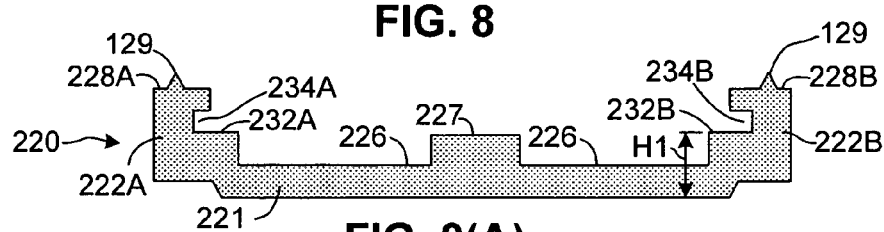
FIGS. 9(A) and 9(B) are simplified cross-sectional end views showing a frame-like body of the PC card assembly of FIG. 8 during assembly.
Figure 9B:
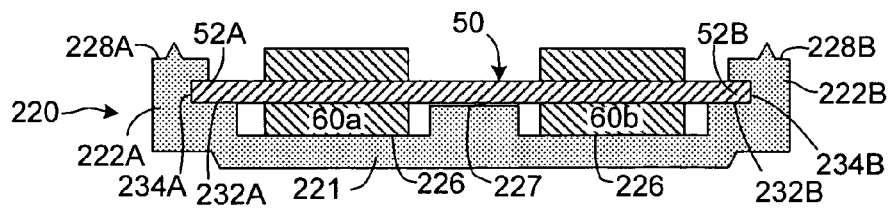

FIG. 8 is an exploded perspective view showing a PC card assembly 200 according to another embodiment of the present invention. FIGS. 9(A) and 9(B) are simplified cross-sectional end views showing PC card assembly 200 in additional detail. As indicated in these figures, PC card assembly 200 includes PCBA 50 and a two-piece housing 210 made up of a frame-like body 220 and top cover 140. Note that PCBA 50 and top cover 140 are essentially identical to the associated structures referenced above by the same reference numbers, and will therefore not be described in additional detail below.

Referring to the lower portion of FIG. 8, similar to frame-like body 120 (discussed above), frame-like body 220 includes a lower wall 221, parallel side rails 222A and 222B, an end rail 223, and defines an open end 224. In addition, frame-like body 220 includes a step-like mounting structure 230 including side shelf portions 232A and 232B, an optional end shelf portion 233, and engagement protrusions 236 that function similar to the first embodiment (described above). In addition, as best illustrated in FIG. 9(A), according to the present embodiment, step-like mounting structure 230 also includes a longitudinal slot including slot portions 234A and 234B respectively formed in side rails 222A and 222B, and located above shelf portions 232A and 232B. The longitudinal slot also includes an optional portion extending into end rail 223 that receives rear edge 53 of PCB 51 when PCB 51 is fully inserted into frame-like body 220. As indicated in FIG. 9(B), longitudinal slot 234 is sized to slidably receive PCB 51 in the horizontal direction (i.e., the direction indicated by arrow H in FIG. 8) during the assembly process. Note that alignment protrusions 236 and alignment notches 56 (formed in PCB 51) are sized such that alignment protrusions 236 press against side edges 52A and 52B during the sliding insertion of PCB 51, and then securely engage alignment notches 56 when PCB 51 is fully inserted into frame-like body 220 (i.e., such that connector 58 abuts free end 224 of side rails 222A and 222B). In addition, as indicated in FIGS. 8 and 9(A), elongated grooves 226, which are separated by a rib 227, are defined in lower wall 221 for facilitating the sliding insertion of PCB 51. After insertion, top cover 140 is secured onto frame-like body 240 in the manner described above with reference to the first embodiment. An advantage provided by PC card assembly 200 is that longitudinal slot 234 minimizes handling of and damage to PCBA 50 during the assembly process, and thus reducing overall manufacturing costs. In addition, longitudinal slot 234 provides a reliable structure for securing PCBA 50 inside housing 210, thereby resisting damage caused, for example, when the PC card is dropped or otherwise subjected to mechanical shock.

Figure 10:
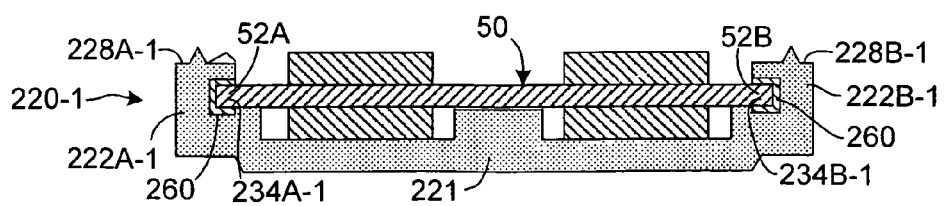
FIG. 10 is a simplified cross-sectional end view showing a portion of a PC card assembly according to another embodiment of the present invention.

FIG. 10 is a simplified cross-sectional end view showing a portion of a PC card assembly including a frame-like body 220-1 according to another embodiment of the present invention. Frame-like body 220-1 is similar to body 220 (discussed above), and differs only in that an elongated metal support (shroud) 260 is molded or otherwise inserted into side rails 222A-1 and 222B-1 to add strength and stability to longitudinal slot portions 234A-1 and 234B-1, which receive side edges 52A and 52B, respectively, of PCB 51 in a manner similar to that described above. In one embodiment, a portion of support 260 is also provided in the slot portion (not shown) defined by end rail 223.

Figure 11:
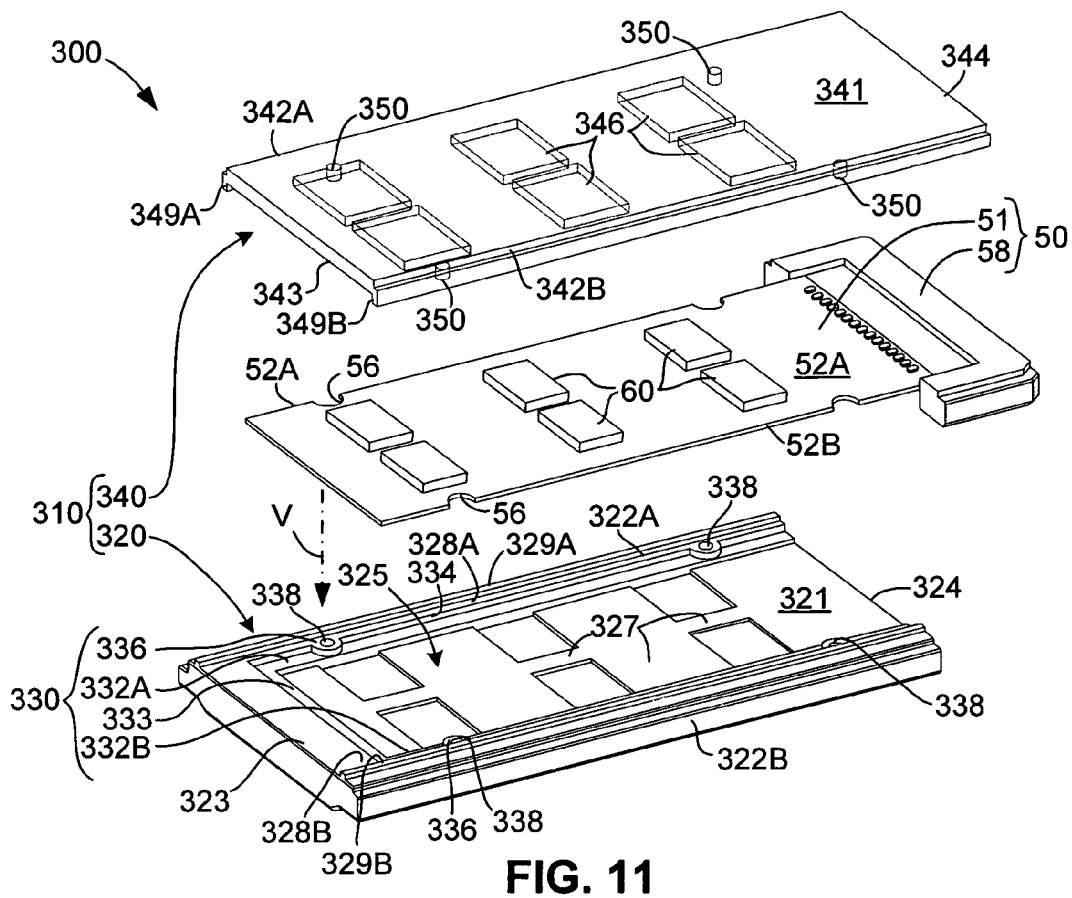
FIG. 11 is an exploded perspective view showing a PC card assembly according to yet another embodiment of the present invention.
Figure 12A:
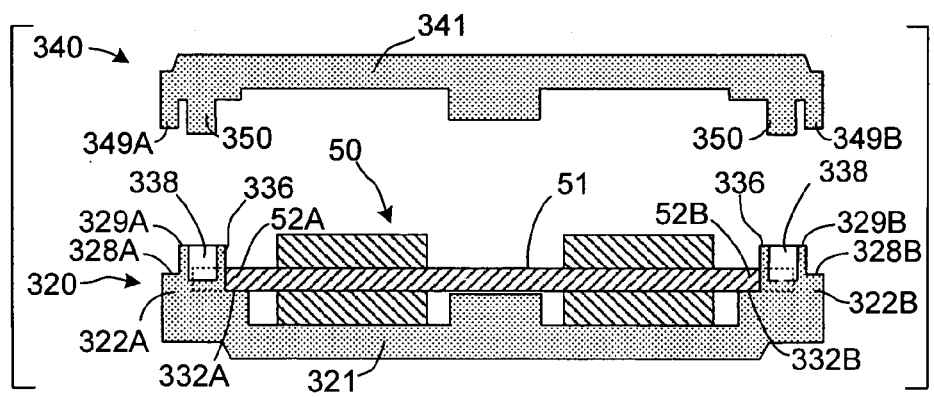
FIGS. 12(A) and 12(B) are simplified cross-sectional end views showing a frame-like body of the PC card assembly of FIG. 11 during sequential assembly stages.
Figure 12B:
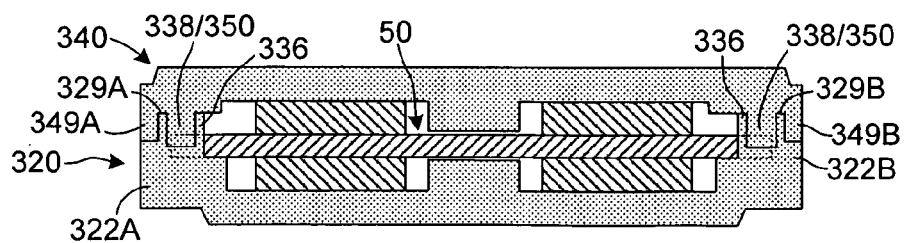

FIG. 11 is an exploded perspective view showing a PC card assembly 300 according to another embodiment of the present invention. FIGS. 12(A) and 12(B) are simplified cross-sectional end views showing PC card assembly 300 in additional detail. As indicated in these figures, PC card assembly 300 includes PCBA 50 (discussed above) and a two-piece housing 310 made up of a frame-like body 320 and top cover 340.

Referring to FIG. 11, similar to frame-like body 120 (discussed above), frame-like body 320 includes a lower wall 321, parallel side rails 322A and 322B, an end rail 323, and defines an open end 324. In addition, frame-like body 320 includes a step-like mounting structure 330 including side shelf portions 332A and 332B, an optional end shelf portion 333, and engagement protrusions 336 that function similar to the first embodiment (described above). In addition, according to the present embodiment, side rails 322A and 322B include peripheral walls 329A and 329B extending along upper surfaces 328A and 328B, and upper surfaces 328A and 328B define several alignment holes 338 that, in the present embodiment, are located adjacent to alignment protrusions 336. Moreover, similar to top cover 140 (described above), top cover 340 includes a substantially flat (upper) wall 341 having side edges 342A and 342B, a rear edge 343 and a front edge 344. In addition, according to the present embodiment, a pair of elongated ribs 349A and 349B extends along side edges 342A and 342B, and several alignment pins 350 extend from the lower surface of upper wall 341. As illustrated in FIGS. 12(A) and 12(B), alignment pins 350 and elongated ribs 349A and 349B are produced to cooperate with peripheral walls 329A and 329B and alignment holes 338 such that top cover 340 is snap-coupled onto frame-like body 320 in the manner illustrated in FIG. 12(B), thereby minimizing production costs by facilitating manual assembly.

Figure 13A:
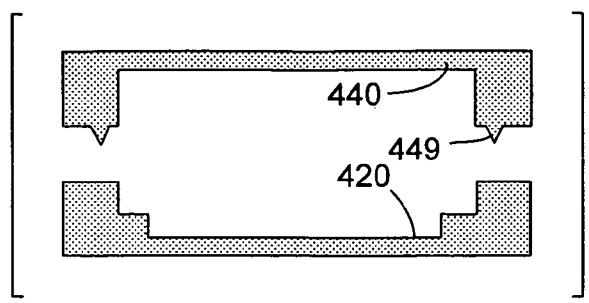
FIGS. 13(A), 13(B), 13(C), and 13(D) are simplified cross-sectional end views showing various ultrasonic welding features utilized according to various alternative embodiments of the present invention.
Figure 13B:
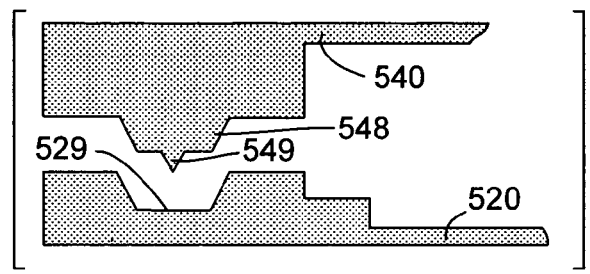
Figure 13C:
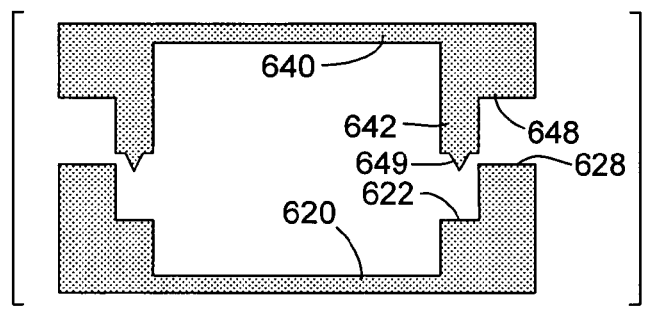
Figure 13D:
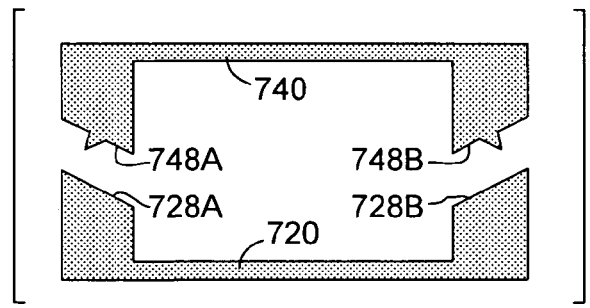

Although the present invention has been described with respect to certain specific embodiments, it will be clear to those skilled in the art that the inventive features of the present invention are applicable to other embodiments as well, all of which are intended to fall within the scope of the present invention. For example, while the specific embodiments described above utilize butt joint ultrasonic welding features in which the ultrasonic bonding features are formed on the upper rail surfaces of the frame-like body, FIG. 13(A) illustrates an alternative butt joint arrangement in which the ultrasonic bonder (i.e., ultrasonic features 449) are formed on top cover 440 (i.e., instead of on frame-like body 420). Other ultrasonic welding features may also be utilized. For example, FIG. 13(B) shows a tongue-and-groove joining structure in which the dimension of a tongue 548 formed on a top cover 540 is slightly larger than a groove 529 formed on frame-like body 520 to facilitate initial alignment between top cover 540 and frame-like body 520. This arrangement reduces the dependency of the final assembly on ultrasonic welding. Further, because the ultrasonic concentrator (i.e., connection feature 549) is located at the lowest point of the joint, there is little likelihood that material overflow to the outside surfaces will occur. The advantage in the enhancement of finishing quality would be obvious to those skilled in the art. Another alternative ultrasonic welding features is illustrated in FIG. 13(C), in which a step-joint arrangement is formed such that ultrasonic welding takes place between the ultrasonic bonder (i.e., ultrasonic bonding features 649) extruded from the bottom surface of the vertical walls 642 from the top cover 640 and shelf portions 622 of frame-like body 620, which is lower in height compared to an outer seam formed by upper wall surface 648 and upper surface 628. This configuration minimizes the likelihood of material overflow to the outside surfaces during the ultrasonic welding process. The footprint of top cover 640 can be designed to be slightly larger than the footprint of frame-like-body 620 to allow for snap-on type of tight fitting. Another alternative ultrasonic welding features is illustrated in FIG. 13(D), which utilizes inclined-interface joining mechanism in which upper surfaces 728A and 728B of frame-like body 720 are inclined inward, and lower surfaces 748A and 748B of top cover 740 are also inclined parallel to the surfaces 748A and 748B, respectively. This arrangement provides a very simple design, yet the installation process takes a relatively short amount of time. The inclined surfaces will allow excessive material during ultrasonic welding process to flow inward, and therefore ensuring a cosmetically appealing finish.

Figure 14:
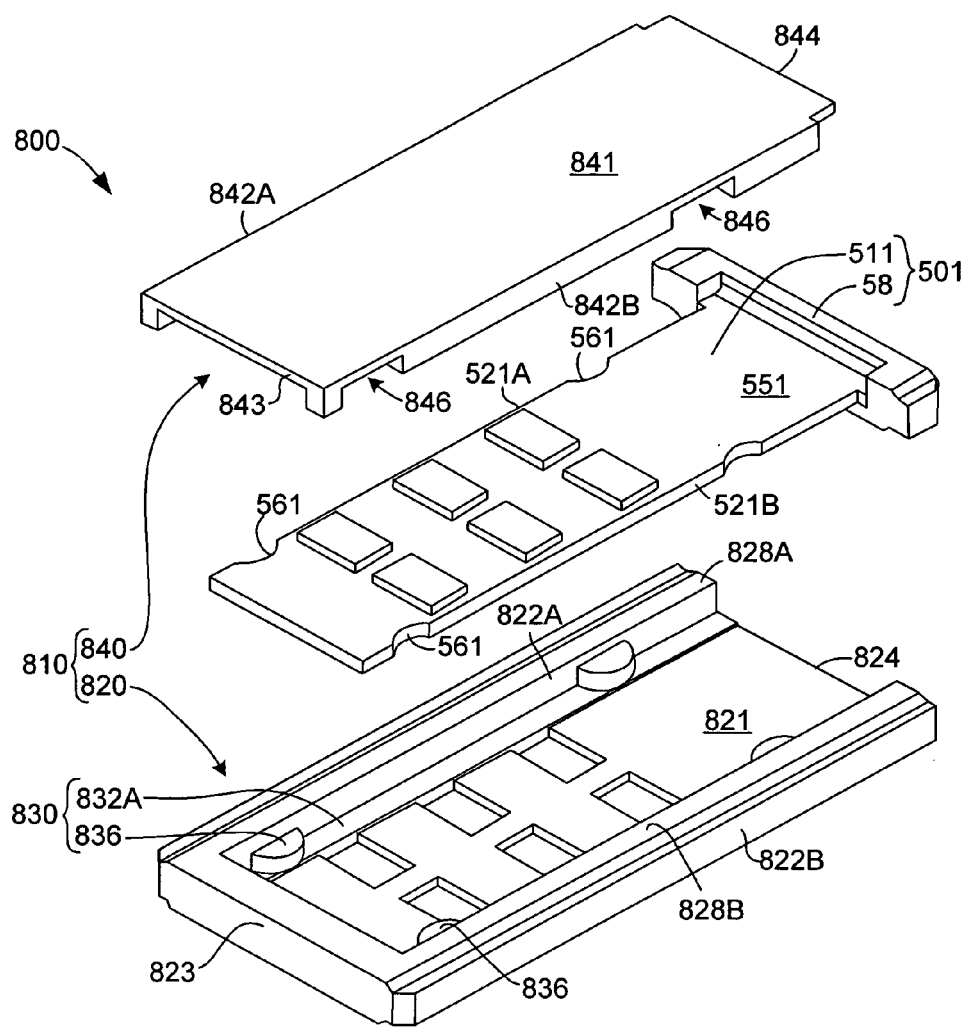
FIG. 14 is an exploded perspective view showing a PC card assembly according to yet another embodiment of the present invention.
Figure 15A:
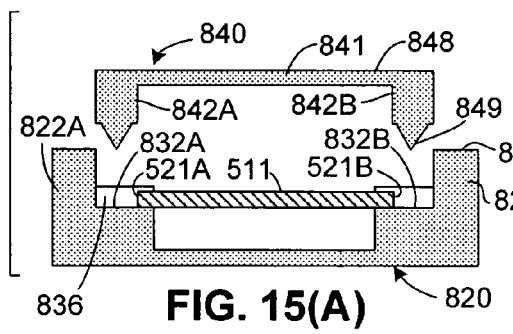
FIGS. 15(A) and 15(B) are simplified cross-sectional end views showing a frame-like body of the PC card assembly of FIG. 14 during sequential assembly stages.
Figure 15B:
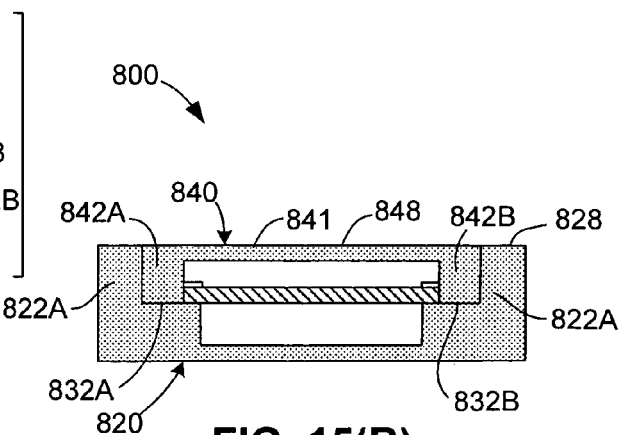

FIG. 14 is an exploded perspective view showing yet another PC card assembly 800 according to another embodiment of the present invention. FIGS. 15(A) and 15(B) are simplified cross-sectional end views showing PC card assembly 800 in additional detail. As indicated in these figures, PC card assembly 800 includes a modified PCBA 501, which includes a connector 58 similar to that discussed above, but also includes a somewhat narrower PCB 511 (i.e., smaller in the width direction between side edges 521A and 521B), and has somewhat smaller alignment notches 561. PC card assembly 800 also includes a two-piece housing 810 made up of a frame-like body 820 and top cover 840.

Referring to FIG. 14, similar to frame-like body 120 (discussed above), frame-like body 820 includes a lower wall 821, parallel side rails 822A and 822B, an end rail 823, and defines an open end 824. In addition, frame-like body 820 includes a step-like mounting structure 830 including side shelf portions (e.g., shelf portion 832A) and engagement protrusions 836 that function similar to the first embodiment (described above). Top cover 840 includes a substantially flat (upper) wall 841 having side edges 842A and 842B, a rear edge 843 and a front edge 844. Side edges 842A and 842B are spaced closer than in previous embodiments, and as shown in FIG. 15(A) include ultrasonic features 849 on a lower edge thereof. In addition, as shown in FIG. 14, side edges 842A and 842B define openings 846 that are aligned to receive alignment protrusions 836 when top cover 840 is mounted onto frame-like body 820. As illustrated in FIGS. 15(A) and 15(B), when PCB 511 is mounted on frame-like body 820 and held in place by alignment protrusions 836, shelf portion 832A is exposed through a (first) gap defined between outer edge 521A and side rail 822A, and shelf portion 832B is exposed through a (second) gap defined between outer edge 521B and side rail 822B. When top cover 840 is subsequently mounted onto frame-like body 820, as indicated in FIG. 15(B), side edges 842A and 842B are received inside side rails 822A and 822B, respectively, and attached to the exposed sections of shelf portions 832A and 832B. Note that after ultrasonic welding is completed, this embodiment provides a structure in which an upper surface 848 of wall 841 is substantially coplanar with upper edges 828 of side rails 822A and 822B, thereby providing a "clean" structure in which any melted material generated during the bonding process is contained within the housing (i.e., the melted material does not extrude from cracks in the casing wall).

Further, in another alternative embodiment, the present invention also includes a few features concerning a balanced version of ExpressCard plug that will position the center of PCBA approximately along the centerline of the ExpressCard in the height direction (i.e., approximately 2.5 mm to both top and bottom of the ExpressCard housing). The balanced version of ExpressCard plug modifies the location of bending contact pins so its distance to the top of ExpressCard will be approximately 2.5 mm less half the thickness of PCBA. For example, if the thickness of the PCB is approximately 0.8 mm, then the bending contact pins will be located approximately 2.1 mm to the top, and approximately 2.9 mm to the bottom of the ExpressCard. On the contrary, the current unbalanced version places the PCBA off-center, and therefore the centerline of the PCBA is not in line with the centerline of the ExpressCard in the thickness direction. This results in a distance of approximately 1.6 mm from bending contact pins to the top of ExpressCard, and approximately 3.4 mm to the bottom of the ExpressCard. The benefit of centering the PCBA to the ExpressCard is enhanced flexibility to the placement of electronic components on either side of the PCB, and the selection of IC components with various heights (i.e., TSOP chip, WSOP chip, etc).

Moreover, various switch and indicator light structures may be incorporated into the housing according to additional alternative features. For example, a mechanical switch can be added as a new feature to the ExpressCard to select the proper protocol mode, either USB mode or PCI Express mode, prior to operation. The switch is located on any of the peripheral surfaces or the top surface of the ExpressCard. A mechanical switch can be added to select a write-protect mode, either as on or off, prior to operation. The write-protect logic is a mechanism to prevent the unintentional alternation of the data stored in the ExpressCard. The switch is located on any of the peripherals or the top surface of the ExpressCard. An LED (Light Emitting Diode) or LED light-pipe can also be added as a new feature to the ExpressCard indicating the status of operation, such as transfer activity, power status, failure indication, etc. Space on the recessed portion of the external top and bottom surfaces of the ExpressCard will be made available for labeling purpose. Such labeling can be provided by sticker or painting. Space on the labeling will be made available for users to mark personal information such as the content of the files being stored in the ExpressCard. Directional marks will also be provided as part of the labeling. The finishing of the frame-like body and top cover can be luminescent gel coated. The finish of the cover can be transparent to offer see-through of the assembled electronic parts and also the blinking signal of LED lights mounted on the PCB. Alternatively, the finish of the covers can be non-transparent to hide the electronic parts.

In addition, although the present invention has been described with specific reference to ExpressCard/34 and ExpressCard/54 Module PC cards, those skilled in the art will recognize that the structures and methods associated with the present invention can also be used in other PC card types (e.g., USB, Slim USB, Memory Stick and SD memory devices), and to structures similar to those of PC cards (i.e., a PCB-based circuit housed in a metal casing and connected to a host system via a connector). Accordingly, the appended claims are directed to all such PC card-like structures, such as some solid state hard drives and compact flash cards.

The invention claimed is:

1. A PC card assembly comprising:
   a printed circuit board assembly (PCBA) including:
      a printed circuit board (PCB) having first and second parallel side edges and first and second parallel end edges located at respective ends of the first and second side edges, and
      a connector mounted on the second end edge of the PCB; and
   a housing comprising a frame-like body including:
      a lower wall,
      first and second parallel side rails respectively connected to opposing side edges of the lower wall, and
      an end rail extending along a first end edge of the lower wall,
   wherein the lower wall, first and second side rails and the end rail define a pocket for receiving the PCB of the PCBA,
   wherein each of the first and second side rails include a step-like mounting structure located inside the pocket, the mounting structure including a peripheral shelf and at least one alignment protrusion extending onto the peripheral shelf, and
   wherein each of the first and second parallel side edges of the PCB define at least one alignment notch located such that when the PCBA is mounted onto frame-like body, the first and second side edges contact the peripheral shelf, and each alignment protrusion is received in a corresponding said alignment notch such that the PCB is maintained in a predetermined position relative to the frame-like body.

2. The PC card assembly according to claim 1, wherein the step-like mounting structure further comprises vertical upper wall portions respectively extending from the peripheral shelf to upper surfaces of the first and second parallel side rails.

3. The PC card assembly according to claim 1,
   wherein the PCBA further comprises a plurality of integrated circuits (ICs) mounted on a lower surface of the PCB, and
   wherein the lower wall of the frame-like body defines a plurality of depressions, each depression receiving at least a portion of a corresponding IC when the PCBA is mounted onto the frame-like body.

4. The PC card assembly according to claim 3, wherein the housing further comprises a top cover mounted onto upper surfaces of the side rails and end rail of the frame-like body, wherein the top cover includes an upper wall that extends over an upper surface of the PCB.

5. The PC card assembly according to claim 4,
wherein the PCBA further comprises a plurality of second ICs mounted on the upper surface of the PCB, and wherein the upper wall of the top cover defines a plurality of depressions, each depression receiving at least a portion of a corresponding one of the second ICs when the top cover is mounted onto the frame-like body.

6. The PC card assembly according to claim 4, wherein the top cover is attached to the frame-like body by welding joints.

* * * * *